(12) United States Patent
Cobb

(10) Patent No.: US 6,748,578 B2
(45) Date of Patent: *Jun. 8, 2004

(54) STREAMLINED IC MASK LAYOUT OPTICAL AND PROCESS CORRECTION THROUGH CORRECTION REUSE

(76) Inventor: Nicolas B. Cobb, 1632 Willow Lake La., San Jose, CA (US) 95131-3553

(*) Notice: Subject to any disclaimer, the term of this patent is extended or adjusted under 35 U.S.C. 154(b) by 0 days.

This patent is subject to a terminal disclaimer.

(21) Appl. No.: 09/944,228

(22) Filed: Aug. 30, 2001

(65) Prior Publication Data

US 2002/0026627 A1 Feb. 28, 2002

Related U.S. Application Data

(63) Continuation of application No. 09/302,561, filed on Apr. 30, 1999, now Pat. No. 6,301,697.

(51) Int. Cl.[7] ............................................. G06F 17/50
(52) U.S. Cl. ........................................ 716/19; 430/30
(58) Field of Search ...................... 716/19, 1; 430/30

(56) References Cited

U.S. PATENT DOCUMENTS

| | | | | |
|---|---|---|---|---|
| 5,502,654 A | | 3/1996 | Sawahata .................... 382/280 |
| 5,655,110 A | | 8/1997 | Krivokapic et al. | |
| 5,723,233 A | | 3/1998 | Garza et al. .................... 430/5 |
| 5,825,647 A | | 10/1998 | Tsudaka | |
| 5,879,844 A | | 3/1999 | Yamamoto et al. | |
| 6,016,357 A | * | 1/2000 | Neary et al. ................. 382/144 |
| 6,049,660 A | * | 4/2000 | Ahn et al. .................... 703/13 |
| 6,077,310 A | | 6/2000 | Yamamoto et al. | |
| 6,120,952 A | | 9/2000 | Pierrat et al. | |
| 6,128,067 A | * | 10/2000 | Hashimoto .................... 355/52 |
| 6,187,483 B1 | | 2/2001 | Capodieci et al. | |
| 6,243,855 B1 | * | 6/2001 | Kobayashi et al. ........... 716/19 |
| 6,249,904 B1 | | 6/2001 | Cobb | |
| 6,263,299 B1 | * | 7/2001 | Aleshin et al. ................ 703/5 |
| 6,269,472 B1 | * | 7/2001 | Garza et al. ................. 716/21 |
| 6,301,697 B1 | * | 10/2001 | Cobb .......................... 716/19 |
| 6,370,679 B1 | * | 4/2002 | Chang et al. ................. 716/19 |
| 6,425,117 B1 | * | 7/2002 | Pasch et al. .................. 716/21 |
| 6,453,452 B1 | | 9/2002 | Chang et al. | |
| 6,453,457 B1 | | 9/2002 | Pierrat et al. | |
| 6,467,076 B1 | * | 10/2002 | Cobb .......................... 716/19 |
| 6,499,003 B2 | * | 12/2002 | Jones et al. .................... 703/6 |

FOREIGN PATENT DOCUMENTS

| | | |
|---|---|---|
| JP | 09319067 A | 12/1997 |
| WO | WO 01/65315 A2 | 9/2001 |

OTHER PUBLICATIONS

International Search Report, PCT/US00/05658, Aug. 31, 2000.
Cobb, N., and Zakhor, A., "Experimental Results on Optical Proximity Correction with Variable Threshold Resist Model," Proceedings of SPIE: Symposium on Optical Microlithography X, vol. 3051, pp. 458–468, 07/97.
Cobb, N., and Zakhor, A., "A Large Area Phase–Shift Mask Design," Proceedings of the SPIE: Symposium on Optical /Laser Microlithography VII, vol. 2197, pp. 348–360, 5/94.
Cobb, N., and Zakhor, A., "Fast, Low–Complexity Mask Design," Proceedings of SPIE: Symposium on Optical/Laser Microlithography VIII, Vo. 2440, pp. 313–327, 5/95.

(List continued on next page.)

Primary Examiner—Stacey Whitmore
(74) Attorney, Agent, or Firm—Christensen O'Connor Johnson Kindness PLLC

(57) ABSTRACT

An EDAM tool is provided with an OPEC module that performs optical and/or process pre-compensations on an IC mask layout in a streamlined manner, reusing determined corrections for a first area on a second area, when the second area is determined to be equivalent to the first area for OPC purposes. The OPC module performs the correction on the IC mask layout on an area-by-area basis, and the corrections are determined iteratively using model-based simulations, which in one embodiment, include resist model-based simulations as well as optical model-based simulations.

36 Claims, 5 Drawing Sheets

OTHER PUBLICATIONS

Cobb, N., and Zakhor, A., "Fast Sparse Aerial Image Calculation for OPC," Proceedings of the SPIE: 15$^{th}$ Annual BACUS Symposium on Photomask Technology and Management, vol. 2621, pp. 534–545, 12/95.

Cobb, N., et al., "Mathematical and CAD Framework for Proximity Correction," Proceedings of the SPIE: Symposium on Optical Microlithography IX, Vo. 2726, pp. 208–222, 6/96.

Maurer, W., et al., "Process Proximity Correction Using an Automated Software Tool," Optical Microlithography XI, Santa Clara, CA, USA, Feb. 25–27, 1998,SPIE vol. 3334, pp. 245–253.

Maurer, W., et al., "Evaluation of a Fast and Flexible OPC Package: OPTISSIMO," 16$^{th}$ Annual Symposium on Photomask Technology and Management, Redwood City, CA, USA, Sep. 18–20, 1996, SPIE vol. 2884, pp. 412–418.

Ohnuma H. et al., "Lithography Computer Aided Design Technology for Embedded Memory in Logic," Microprocesses and Nanotechnology '98. 1998 International Microprocesses and Nanotechnology Conference, Kyoungju, South Korea, Jul. 13–16, 1998, vol. 37, No. 12B, pp. 6686–6688.

Cobb, N., and Y. Granik, "Model–Based OPC Using the MEEF Matrix," *Proceedings of SPIE, vol. 4889: 22nd Annual BACUS Symposium on Photomask Technology*, Monterey, Calif., Sep. 30–Oct. 4, 2002, p. 147–158.

Cobb, N., and Y. Granik, "Using OPC to Optimize for Image Slope and Improve Process Window," (Nov. 20, 2002), *Proceedings of SPIE, vol. 5130: Photomask Japan*, Yokohama, Japan, Apr. 16–18, 2003, p. 42–48.

Granik, Y., "Generalized MEEF Theory," *Interface 2001*, Nov. 2001 (13 pp.).

Granik, Y., and N. Cobb, "MEEF as a Matrix," *Proceedings of SPIE, vol. 4562: 21st Annual BACUS Symposium on Photomask Technology*, Monterey, Calif., Oct. 2–5, 2001, pp. 980–991.

Granik, Y., and N. Cobb, "Two–Dimensional G–MEEF Theory and Applications," *Proceedings of SPIE*, vol. 4754: *Symposium on Photomask and Next–Generation Lithography Mask Technology IX*, Yokohama, Japan, Apr. 23–25, 2002, 146–155.

* cited by examiner

CORRECTION DATABASE

| UNCORRECTED WINDOWED AREA | CORRECTED WINDOWED AREA |
|---|---|
| {$POLY_1$ ($X_1 Y_1, X_2, Y_2 \ldots TAG_1$), $PATH_1$ ($X_3 Y_3 \ldots TAG_2$), $POLY_2$ ($X_4, Y_4 \ldots TAG_3$), ....} | {$POLY'_1$ ($X'_1 Y'_1, X'_2, Y'_2 \ldots$), $PATH'_1$ ($X'_3 Y'_3 \ldots$), $POLY'_2$ ($X'_4, Y'_4 \ldots$), ....} |
|  |  |

FIG. 4

STREAMLINED IC MASK LAYOUT OPTICAL AND PROCESS CORRECTION THROUGH CORRECTION REUSE

This is a continuation of application Ser. No. 09/302,561, filed Apr. 30, 1999 now U.S. Pat. No. 6,301,697.

BACKGROUND OF THE INVENTION

1. Field of the Invention

The present invention relates to the field of integrated circuit (IC) design. More specifically, the present invention relates to the application of optical and process pre-compensations to an IC mask layout.

2. Background Information

Over the years, because of the ever increasing complexity of IC designs, IC designers have become more and more reliant on electronic design automation (EDA) tools to assist them in designing ICs. These tools span the entire design process, from synthesis, placement, routing, to layout verification.

In the case of sub-micron ICs, designers are increasingly reliant on EDA tools to make the necessary pre-compensations (also referred to as corrections) to the edges of various geometries of an IC mask layout, to achieve the desired sub-micron IC images, as the "critical dimension" of the line-width becomes smaller than the wavelength of the light source. (The term mask as used herein is intended to include reticle also.) The various techniques for automatically making these corrections are commonly referred to as optical proximity corrections or optical and process corrections. In the later case, pre-compensations are made for process as well as optical distortions. Whether it is just for optical distortions only or for both types of distortions, hereinafter, all pre-compensations will be generically referred to as OPC.

Generally speaking, OPC techniques can be classified as rule-based techniques or model-based techniques. Under rule-based techniques, certain predetermined corrections are made if certain pre-specified conditions are detected, e.g. when certain geometric features are employed in the presence of certain other features within certain critical distances. Under model-based techniques, the corrections are calculated through computer simulations employing various models, e.g. optical models. Thus, generally speaking, rule-based techniques are less accurate, but they are less computational intensive. On the other hand, model-based techniques are more accurate, but they are more computationally intensive. Furthermore, for certain large ICs, some model-based techniques border on impractical, as they require very powerful computing systems. Therefore, designers of complex ICs are often faced with this difficult choice of accuracy versus computational efficiency.

Thus, a more streamlined model-based OPC technique that offers the desired improved accuracy but with less of the computational burden is desired.

SUMMARY OF THE INVENTION

An EDA tool is provided with an OPC module that performs optical and/or process pre-compensations on an IC mask layout in a streamlined manner, reusing determined corrections for a first area on a second area, when the second area is determined to be equivalent to the first area for OPC purposes. The OPC module performs the correction on the IC mask layout on an area-by-area basis, and the corrections are determined iteratively using model-based simulations, which in one embodiment, include resist model-based simulations as well as optical model-based simulations.

BRIEF DESCRIPTION OF DRAWINGS

The present invention will be described by way of exemplary embodiments, but not limitations, illustrated in the accompanying drawings in which like references denote similar elements, and in which:

FIG. 4 further illustrates a correction database in accordance with one embodiment;

DETAILED DESCRIPTION OF THE INVENTION

In the following description, various aspects of the present invention will be described, and various details will be set forth in order to provide a thorough understanding of the present invention. However, it will be apparent to those skilled in the art that the present invention may be practiced with only some or all aspects of the present invention, and the present invention may be practiced without the specific details. In other instances, well known features are omitted or simplified in order not to obscure the present invention.

Parts of the description will be presented using terminology commonly employed by those skilled in the art to convey the substance of their work to others skilled in the art, such as mask layouts, geometries, model-based simulations and so forth. Also, parts of the description will also be presented in terms of operations performed by a computer system, using terms such as determining, generating and so forth. As well understood by those skilled in the art, these operations and quantities operated on, take the form of electrical, magnetic, or optical signals capable of being stored, transferred, combined, and otherwise manipulated through electrical/optical components of a digital system; and the term digital system includes general purpose as well as special purpose data processing machines, systems, and the like, that are standalone, adjunct or embedded.

Various operations will be described as multiple discrete steps performed in turn in a manner that is most helpful in understanding the present invention. However, the order of description should not be construed as to imply that these operations are necessarily performed in the order they are presented, or even order dependent. Lastly, repeated usage of the phrase "in one embodiment" does not necessarily refer to the same embodiment, although it may.

Figure 1:
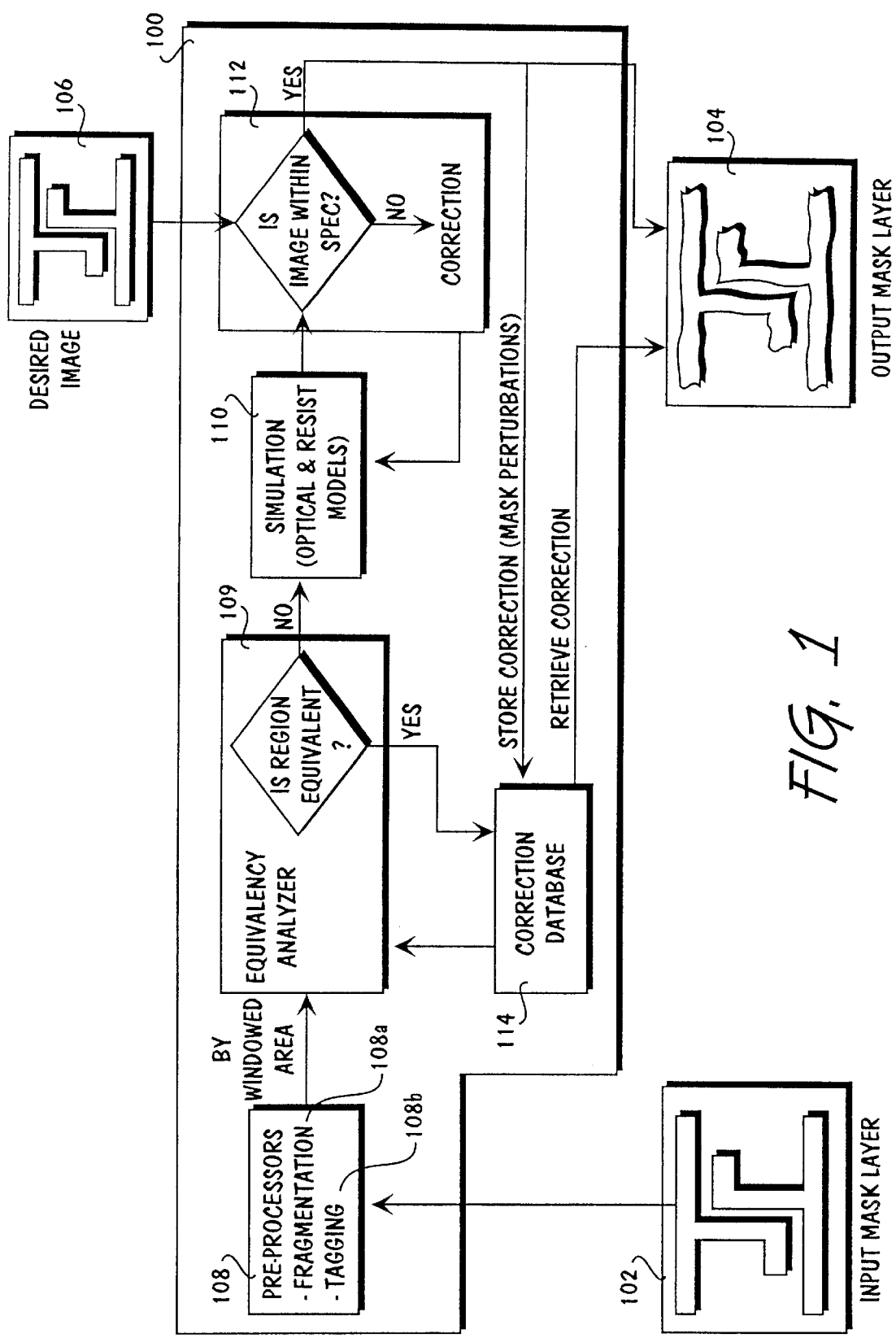
FIG. 1 illustrates an overview of the present invention in accordance with one embodiment.

Referring now to FIG. 1, wherein a block diagram illustrating an overview of the present invention in accordance with a number of embodiments is shown. Shown is OPC module 100 incorporated with the teachings of the present invention, which includes automatic performance of OPC to IC mask layout 102, on an area-by-area basis, to generate corrected IC mask layout 104. In particular, OPC module 100 reuses corrections determined for a first area on a second area, when the second area is considered to be equivalent to the first area for OPC purposes. As a result, the amount of computations required to perform OPC on IC mask layout 102 to generate IC mask layout 104 are substantially reduced.

For the illustrated embodiment, OPC module 100 includes a number of pre-processors 108, equivalency analyzer 109, simulator 110, correction post-processor 112, and correction database 114, operationally coupled to each other as shown. Pre-processors 108 include in particular, fragmentation pre-processor 108a and tagging pre-processor 108b. Pre-processors 108 collectively pre-process the formal description of IC mask layout 102 to prepare the descriptive data for the subsequent analyses to determine the appropriate correction. In particular, pre-processors 108 collectively prepare the descriptive data to enable the subsequent analyses to be efficiently performed in accordance with the streamlined approach of the present invention, that is allowing the determined corrections for one area to be efficiently reused for another OPC equivalent area. Equivalency analyzer 109 performs pattern recognition analysis to determine if two areas are "equivalent" for OPC purposes, on an area-by-area basis. If equivalent, analyzer 109 further causes the earlier determined corrections to be reused on the area to avoid repeating the costly re-computations. Simulator 110 performs for each "unique" area, model-based analyses to determine the appropriate corrections for the particular "unique" area. Correction post-processor 112 makes the determined corrections for each area. For each "unique" area, the simulation and correction process is performed multiple times, iteratively, referencing desired results 106, until the corrected mask layout is considered to be sufficiently pre-compensated that it is likely to yield the desired image, within a predetermined tolerance level. Correction database 114 stores the data necessary to allow two areas to be compared and determined whether they are equivalent for OPC purposes. Furthermore, correction database 114 stores the data necessary to allow the corrections determined for one area to be reused for another area, when the latter area is determined to be equivalent to the former area for OPC purposes.

Figure 2:
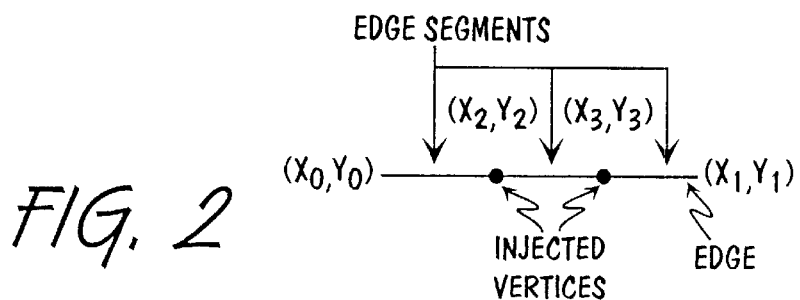
FIG. 2 illustrates the concept of fragmenting an edge of a geometry feature of an IC mask layout.

Continuing to refer to FIG. 1, for the illustrated embodiment, IC mask layout 102 is described in GDS II format, comprises of polygons and paths, more specifically, vertices of polygons and paths, among other things. Fragmentation pre-processor 108a takes each edge of the geometries, and injects additional "vertices" to further fragment the edge into multiple edge segments or fragments, for analysis purpose, thereby improving the resolution of the subsequent analyses performed to determine the appropriate corrections (see. FIG. 2). As those skilled in the art will appreciate, such injection of additional vertices and fragmentation of the edges into multiple edge fragments result in substantial increase in computational cost for the subsequent simulation analyses. As will be described in more details below, to alleviate this substantial increase in computational cost for the improved accuracy, equivalency analyzer 109 advantageously ensures the costly computations are performed only once for each OPC "unique" area, and reuses the determined corrections on equivalent areas, from an OPC perspective. To facilitate efficient performance of the equivalent analysis by analyzer 109, tagging pre-processor 108b employs tag identifiers to characterize the geometric features of each area of IC mask layout 102. Examples of tag identifiers are identifiers that characterize an edge fragment as a vertical edge fragment, a horizontal edge fragment, an edge fragment adjacent to a line end edge fragment, a concave corner edge fragment, and so forth. Tagging is the subject of co-pending application, Ser. No. 09/302,700, entitled "Improved Method and Apparatus For Sub-micron IC Design Using Edge Fragment Tagging", and filed contemporaneously with the present application, which is hereby fully incorporated by reference.

Figure 3A:
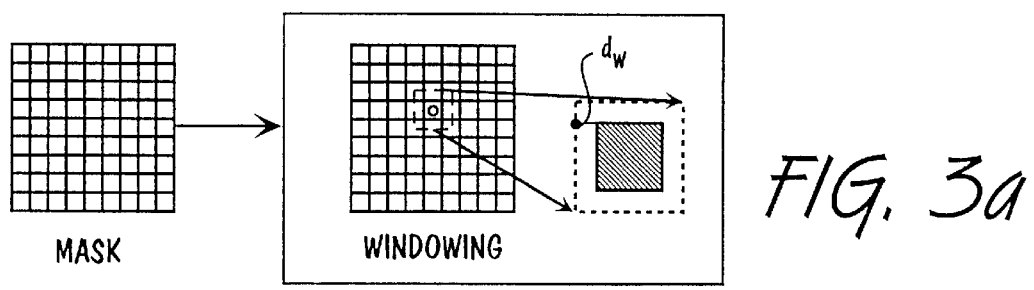
FIGS. 3a–3b illustrate the concept of windowed area for OPC analysis.
Figure 3B:
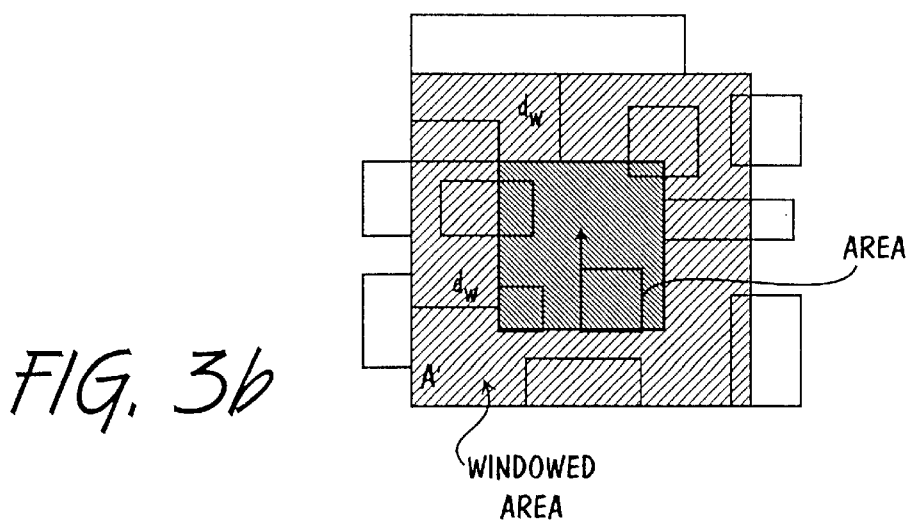

For the illustrated embodiment, equivalency analyzer 109 efficiently performs the equivalent analysis on an "windowed area"-by-"windowed area" basis. A windowed area encircles and includes an original area. The windowed area is created by enlarging the perimeter of the original area by an encircling ring of immediately adjacent areas to be included for OPC analysis. The size of the encircling ring is defined by a window dimension ($d_w$). Geometry features disposed within this encircling area are considered to be significant from an OPC analysis point of view (see FIGS. 3a–3b). In alternate embodiments, different $d_w$ may be employed for different enlargement directions. Analyzer 109 compares the geometric features of a windowed area against the geometric features of a previously corrected windowed area (in its pre-correction state), using the tag identifiers tagged against the edge fragments by tagging pre-processor 108b. In one embodiment, two windowed areas are considered equivalent if and only if the two areas are identical in all aspects, that is the number, size and relative locations of the geometric features. In other embodiments, two windowed areas are considered equivalent if the two windowed areas have the same number of geometric features, and the sizes and relative locations of the geometric features are all within predetermined tolerance levels. In yet other embodiments, other criteria may be employed instead to determine equivalency. Simulator 110 performs the simulation analyses for the windowed unique areas of IC mask layout 102, using both resist as well as optical models. In one embodiment, the resist model employed is a variable threshold resist (VTR) model.

Finally, correction database 114 is employed to store the description data of each windowed OPC unique area of an IC mask layout, and the corrected state of each of these windowed OPC unique areas (see FIG. 4). In an alternate embodiment, in lieu of the corrected state of each of these windowed OPC unique areas, the corrections, also referred to as mask perturbations, to be made to each of the windowed OPC unique area are stored instead. In yet another embodiment, both the corrections, i.e. the mask perturbations, as well as the corrected states of the windowed OPC unique areas are stored.

Except for the advantageous employment of correction database 114 to store the data necessary, and their usage to reuse corrections determined through simulations for one area on another area that is considered to be OPC equivalent to the earlier area, pre-processors 108 (exclusion of tagging pre-processor 108b), simulator 110 and correction post processors 112, (exclusion of equivalency analyzer 109) have been otherwise previously described in detail in Cobb et al., "Large area phase-shift mask design", In Proceedings of SPIE Symposium on Optical Microlithography, Vol. 2197, pages 348–360, 1994; Cobb et al., "Fast low complexity mask design", In Proceedings of SPIE Symposium on Optical Microlithography, Vol. 2440, pages 313–327, 1995; Cobb et al., "Fast sparse aerial image calculation for OPC", "In Proceedings of BACUS Symposium on Photomask Technology", Vol. 2621, pages 534–545, 1995; Cobb et al., "A Mathematical and CAD framework for Proximity Correction", In Proceedings of SPIE Symposium on Optical Microlithography, Vol. 2726, pages 348–360, 1996; and Cobb et al., "Experimental Results on Optical Proximity Corrections with Variable Threshold Resist Model", In Proceedings of SPIE Symposium on Optical Microlithography X, Vol. 3051, pages 458–468, 1997. These articles are hereby fully incorporated by reference.

Figure 5:
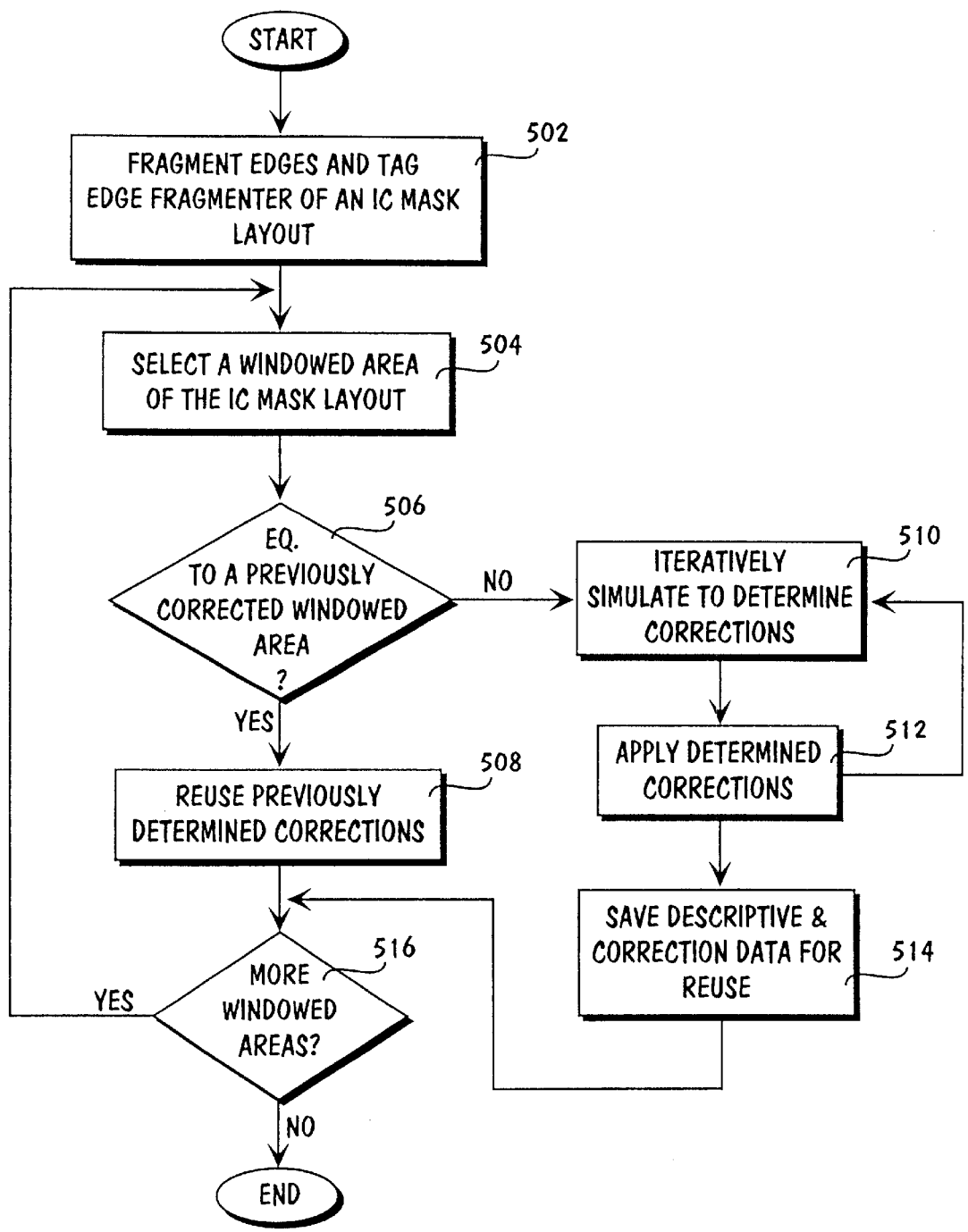
FIG. 5 illustrates the operational flow of the OPC module in accordance with one embodiment.

Referring now to FIG. 5, wherein a flow diagram illustrating the operational flow of the above described OPC module in accordance with one embodiment is shown. (The parenthesized reference numbers refer to elements of FIG. 1.) As illustrated, at 502, the fragmentation pre-processor (108a) fragments edges and the tagging pre-processor (108b) tags edge fragments of an IC mask layout (102). At 504, the equivalency analyzer (109) selects a windowed area of the IC mask layout for analysis. The order of analysis is unimportant. In one embodiment, it is systematic, in another, it is arbitrary. At 506, the analyzer (109) determines if the windowed area is equivalent to a previously corrected windowed area. For the illustrated embodiment, the analyzer (109) retrieves the descriptive data of the pre-correction state of a previously corrected windowed area from a correction database (114). The equivalent analysis is efficiently performed using the tag identifiers applied by tagging pre-processor (109).

If the windowed area is determined to be OPC equivalent to a previously corrected area, the process continues at 508, where the analyzer (109) merely causes the previously determined corrections to be reused on the area to avoid the necessity having to re-perform the timely simulations. In one embodiment, the analyzer (109) causes the corrected state of the previously corrected area to be retrieved and output from correction database (114). In another embodiment, the analyzer (109) causes the previous determined corrections or mask perturbations to be retrieved from correction database (114) and applied to the IC mask layout (102) by correction post-processor (112).

On the other hand, if the windowed area is determined to be non-equivalent to any of the previously corrected areas, from an OPC perspective, the process continues at 510, where the simulator (110), in conjunction with correction post-processor (112), iteratively determines the corrections to be made. Upon determining and applying the determined corrections, at 514, simulator (110) and correction post-processor (112) further save the data necessary for the determined corrections to be subsequently reused on another OPC equivalent windowed area. Simulator (110) and/or correction post-processor (112) save the descriptive data of the pre-correction state of the windowed area into correction database (114). Additionally, in one embodiment, correction post-processor (112) also saves the corrected state of the windowed area. In another embodiment, correction post-processor (112) saves the corrections to be applied instead. In yet another embodiment, correction post-processor (112) saves both.

From operation 508 or 514, the process continues at 516, where analyzer (109) determines if all areas have been processed. Analyzer (109) repeats the process from operation 504 through operation 514, selectively invoking simulator (110) and correction post-processor (112) as many times as it is necessary, until all areas of IC mask layout (102) have been processed and corrected.

Figure 6:
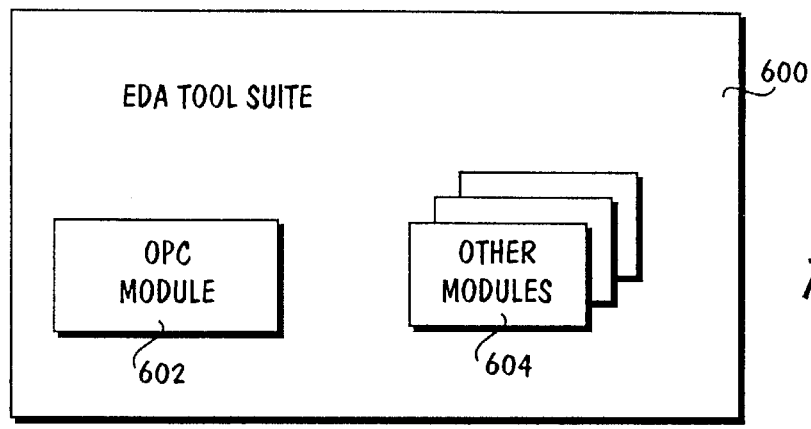
FIG. 6 illustrates an example EDA tool incorporated with the OPC module of the present invention, in accordance with one embodiment.

Referring now to FIG. 6, wherein an EDA tool incorporated with the OPC module of the present invention in accordance with one embodiment is shown. As illustrated, EDA tool suite 600 includes OPC module 602 incorporated with the teachings of the present invention as described earlier with references to FIGS. 1–5. Additionally, EDA tool suite 600 includes other tool modules 604. Examples of these other tool modules 602 include but not limited to synthesis module, phase assignment module, layout verification module and so forth.

Figure 7:
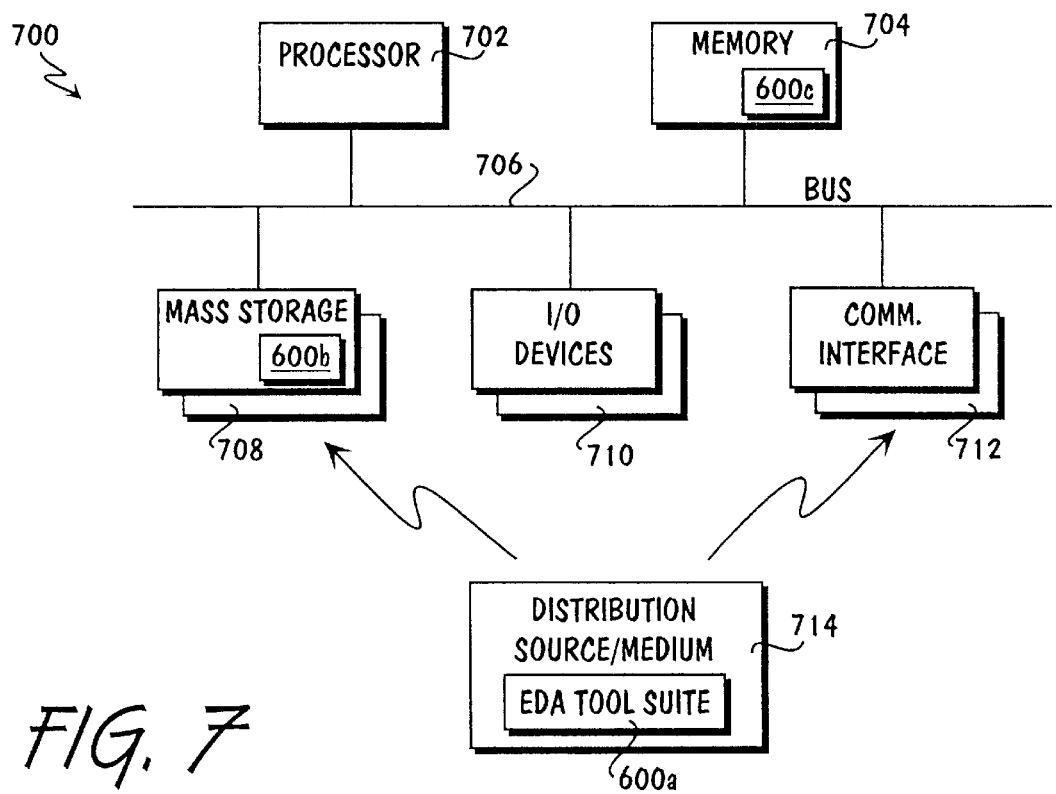
FIG. 7 illustrates an example computer system suitable to be programmed with the programming instructions implementing the EDA tool of FIG. 6.

FIG. 7 illustrates one embodiment of a computer system suitable for use to practice the present invention. As shown, computer system 700 includes processor 702 and memory 704 coupled to each other via system bus 706. Coupled to system bus 706 are non-volatile mass storage 708, such as hard disks, floppy disk, and so forth, input/output devices 710, such as keyboard, displays, and so forth, and communication interfaces 712, such as modem, LAN interfaces, and so forth. Each of these elements perform its conventional functions known in the art. In particular, system memory 704 and non-volatile mass storage 708 are employed to store a working copy and a permanent copy of the programming instructions implementing the above described teachings of the present invention. System memory 704 and non-volatile mass storage 708 may also be employed to store the IC designs. The permanent copy of the programming instructions to practice the present invention may be loaded into non-volatile mass storage 708 in the factory, or in the field, using distribution source/medium 714 and optionally, communication interfaces 712. Examples of distribution medium 714 include recordable medium such as tapes, CDROM, DVD, and so forth. In one embodiment, the programming instructions are part of a collection of programming instructions implementing EDA tool 600 of FIG. 6. The constitution of elements 702–714 are well known, and accordingly will not be further described.

In general, those skilled in the art will recognize that the present invention is not limited to the embodiments described. Instead, the present invention can be practiced with modifications and alterations within the spirit and scope of the appended claims. The description is thus to be regarded as illustrative, instead of restrictive on the present invention.

Thus, a streamlined approach to performing optical and process corrections to an IC mask layout, through correction reuse, has been described.

What is claimed is:

1. A method for performing optical and process correction (OPC) on an integrated circuit (IC) mask layout comprising:

receiving an integrated circuit (IC) mask layout that defines a mask to be created;

selectively tagging edges in the mask layout with tag identifiers to characterize the edges in the IC mask layout;

determining OPC for the IC mask layout on an area-by-area basis, each area being an aerial subset at the IC mask layout;

determining if a second area is equivalent to a previously corrected first area prior to determining OPC for the second area, using the tag identifiers; and reusing the determined OPC for a first area on the second area if the second area is considered to be equivalent to the first area for OPC purposes.

2. The method of claim 1, wherein said OPC for each area is determined iteratively employing model-based simulations.

3. The method of claim 2, wherein said model-based simulations include resist as well as optical model-based simulations.

4. The method of claim 3, wherein each of said resist model-based simulations employs a variable threshold resist model.

5. The method of claim 1, wherein the method further comprises saving the determined OPC, and pre-correction states of the corresponding corrected areas.

6. The method of claim 5, wherein said reusing comprises retrieving for the second area, the saved OPC determined for the first area, and applying the retrieved OPC to the second area.

7. The method of claim 1, wherein the method further comprises saving the corrected areas in their corrected states as well as their pre-correction states.

8. The method of claim 7, wherein said reusing comprises retrieving for the second area, the corrected first area in its corrected state, and generating a copy for use as the corrected second area.

9. An article of manufacture comprising:
a recordable medium having recorded thereon programming instructions for use to program a computer system to enable the computer system to be able to:
receive an integrated circuit (IC) mask layout that defines a mask to be created;
selectively tag edges in the mask layout with tag identifiers to characterize the edges in the IC mask layout;
determine optical and process correction (OPC) for the integrated circuit (IC) mask layout on an area-by-area basis, each area being an aerial subset of the IC mask layout;
determine if a second area is equivalent to a previously corrected first area prior to determining OPC for the second area, using the tag identifiers; and
reuse the determined OPC for a first area on a second area if the second area is considered to be equivalent to the first area for OPC purposes.

10. The article of claim 9, wherein said programming instructions enable the computer system to determine the OPC for each area iteratively employing model-based simulations.

11. The article of claim 10, wherein said programming instructions enable the computer system to include resist as well as optical model-based simulations when performing said model-based simulations.

12. The article of claim 11, wherein said programming instructions enable the computer system to employ a variable threshold resist model when performing a resist model-based simulation.

13. The article of claim 9, wherein said programming instructions further enable the computer system to save the determined OPC, and pre-correction states of the corresponding corrected areas.

14. The article of claim 13, wherein said programming instructions enable the computer system to retrieve for the second area, the saved OPC determined for the first area, and to apply the retrieved OPC to the second area.

15. The article of claim 9, wherein said programming instructions further enable the computer system to save the corrected areas in their corrected states as well as their pre-correction states.

16. The article of claim 15, wherein said programming instructions further enable the computer system to retrieve for the second area, the corrected first area in its corrected state, and to generate a copy for use as the corrected second area.

17. A computer system comprising:
a storage medium having stored therein a plurality of programming instructions; and
a processor coupled to the storage medium to execute the programming instructions to:
receive an integrated circuit (IC) mask layout that defines a mask to be created;
selectively tag edges in the mask layout with tag identifiers to characterize the edges in the IC mask layout;
determine optical and process correction (OPC) for the integrated circuit (IC) mask layout on an area-by-area basis, each area being an aerial subset of the IC mask layout; and
determine if a second area is equivalent to a previously corrected first area prior to determining OPC for the second area, using the tag identifiers, wherein the determined OPC for a first area are reused on the second area if the second area is considered to be equivalent to the first area for OPC purposes.

18. The computer system of claim 17, wherein the processor executes the programming instructions to iteratively determine the OPC for each area employing model-based simulations.

19. The computer system of claim 18, wherein the processor executes the programming instructions to perform resist as well as optical model-based simulations.

20. The computer system of claim 19, wherein the processor executes the programming instructions to perform the resist model-based simulations employing a variable threshold resist model.

21. The computer system of claim 17, wherein the processor further executes the programming instructions to save the determined OPC, and pre-correction states of the corresponding corrected areas.

22. The computer system of claim 21, wherein the processor further executes the programming instructions to retrieve for the second area, the saved OPC determined for the first area, and to apply the retrieved OPC to the second area.

23. The computer system of claim 17, wherein the processor further executes the programming instructions to save the corrected areas in their corrected states as well as their pre-correction states.

24. The computer system of claim 23, wherein the processor further executes the programming instructions to retrieve for the second area, the corrected first area in its corrected state, and to generate a copy for use as the corrected second area.

25. A method for performing optical and process correction (OPC) on an integrated circuit (IC) mask layout comprising:
determining OPC for the IC mask on an area-by-area basis, each area being an aerial subset of the IC mask layout;
saving the determined OPC and pre-correction states of an area;
determining if a second area is equivalent to a previously corrected first area prior to determining OPC for the second area; and
reusing the OPC determined for a first area on the second area if the second area is equivalent to the first area for OPC purposes.

26. The method of claim 25, wherein said reusing comprises retrieving for the second area, the saved OPC determined for the first area, and applying the retrieved OPC to the second area.

27. A method for performing optical and process correction (OPC) on an integrated circuit (IC) mask layout comprising:
determining OPC for the mask layout on an area-by-area basis, each area being an aerial subset of the mask layout;

saving the corrected areas in their corrected states as well as their pre-correction states;

determining if a second area is equivalent to a first corrected area; and reusing the corrected state of a first area as the second area if the second area is equivalent to the first area for OPC purposes.

28. The method of claim 27, wherein said reusing comprises retrieving for the second area, the corrected first area in its corrected state, and generating a copy for use as the corrected second area.

29. An article of manufacture comprising:

a recordable medium having recorded thereon programming instructions for use to program a computer system to enable the computer system to be able to:

determine optical and process correction (OPC) for an integrated circuit (IC) mask layout on an area-by-area basis, each area being an aerial subset of the IC mask layout;

save the determined OPC and pre-correction states of the corresponding areas; and reuse the OPC determined for a first area on a second area if the second area is equivalent to the first area for OPC purposes.

30. The article of claim 27, wherein said programming instructions enable the computer system to retrieve for the second area, the saved OPC determined for the first area, and to apply the retrieved OPC to the second area.

31. An article of manufacture comprising:

a recordable medium having recorded thereon programming instructions for use to program a computer system to enable the computer system to be able to:

determine optical and process correction (OPC) for an integrated circuit (IC) mask layout on an area-by-area basis, each area being an aerial subset of the IC mask layout;

save the corrected areas in their corrected states as well as their pre-correction states; and reuse the corrected state of a first area as the second area if the second area is equivalent to the first area for OPC purposes.

32. The article of claim 31, wherein said programming instructions further enable the computer system to retrieve for the second area, the corrected first area in its corrected state, and to generate a copy for use as the corrected second area.

33. A computer system comprising:

a storage medium having stored therein a plurality of programming instructions; and a processor coupled to the storage medium to execute the programming instructions to:

determine optical and process correction (OPC) for an integrated circuit (IC) mask layout on an area-by-area basis, each area being an aerial subset of the IC mask layout; and save the determined OPC and pre-correction states of the corresponding corrected areas, wherein the OPC determined for a first area are reused on a second area if the second area is equivalent to the first area for OPC purposes.

34. The computer system of claim 33, wherein the processor further executes the programming instructions to retrieve for the second area, the saved OPC determined for the first area, and to apply the retrieved OPC to the second area.

35. A computer system comprising:

a storage medium having stored therein a plurality of programming instructions; and a processor coupled to the storage medium to execute the programming instructions to:

determine optical and process correction (OPC) for an integrated circuit (IC) mask layout on an area-by-area basis, each area being an aerial subset of the IC mask layout; and save the corrected areas in their corrected states as well as their pre-correction states, wherein the corrected state of a first area is reused as the second area if the second area is equivalent to the first area for OPC purposes.

36. The computer system of claim 35, wherein the processor further executes the programming instructions to retrieve for the second area, the corrected first area in its corrected state, and to generate a copy for use as the corrected second area.

* * * * *